(12) United States Patent
Stolpe et al.

(10) Patent No.: US 10,541,832 B2
(45) Date of Patent: Jan. 21, 2020

(54) METHOD FOR CONFIGURING CONTROL UNITS

(71) Applicant: dSPACE digital signal processing and control engineering GmbH, Paderborn (DE)

(72) Inventors: Ralf Stolpe, Hövelhof (DE); Michael Heier, Schloß Holte-Stukenbrock (DE); Jürgen Hölker, Lippstadt (DE)

(73) Assignee: DSPACE DIGITAL SIGNAL PROCESSING AND CONTROL ENGINEERING GMBH, Paderborn (DE)

( * ) Notice: Subject to any disclaimer, the term of this patent is extended or adjusted under 35 U.S.C. 154(b) by 40 days.

(21) Appl. No.: 15/971,268

(22) Filed: May 4, 2018

(65) Prior Publication Data
US 2018/0323999 A1 Nov. 8, 2018

(30) Foreign Application Priority Data
May 5, 2017 (EP) .................................. 171659687

(51) Int. Cl.
*G05B 19/042* (2006.01)
*H04L 12/40* (2006.01)
*G06F 17/50* (2006.01)

(52) U.S. Cl.
CPC .... *H04L 12/40013* (2013.01); *G05B 19/0426* (2013.01); *G06F 17/5009* (2013.01);
(Continued)

(58) Field of Classification Search
CPC .................. H04L 12/40013; G06F 17/5009
See application file for complete search history.

(56) References Cited

U.S. PATENT DOCUMENTS 8,418,139 B2    4/2013  Dhanakshirur et al.
8,462,014 B1 *  6/2013  Kardos ................ H02J 13/001
                                              340/870.02
(Continued)

FOREIGN PATENT DOCUMENTS

DE    102011121879 A1    6/2013
EP         2153289 B1    2/2010
WO    WO 2014/023335 A1  2/2014

OTHER PUBLICATIONS

EP, Extended European Search Report for EP application No. 14196875.0, dated May 22, 2015.
(Continued)

*Primary Examiner* — Farley Abad
(74) *Attorney, Agent, or Firm* — Orrick, Herrington & Sutcliffe LLP; Joseph A. Calvaruso

(57) ABSTRACT

Method for configuring a functionality of real and/or simulated control units, comprising a functionality belonging to a functionality class, such that the functionality has one or more functions and parameters dependent on the functionality class. The functionality is further assigned to at least one control unit. The functionality class has categories, including an else category and a default category and its functionalities each belong to a category. A predetermined value is stored for parameter and if the functionality is assigned to the default category, the predetermined value is adopted for the parameter. If the predetermined value of the parameter changes, the change is adopted for all functionalities which have already been assigned to the default category. And the control unit assigned to the functionality is configured with the function and the values of the parameters of the functionality.

14 Claims, 4 Drawing Sheets

| S | N | ECU | K | P1 | P2 | P3 | P4 | P5 | P6 |
|---|---|---|---|---|---|---|---|---|---|
| SIG1 | MES1 | ECU1 | K3 | 1 | 64 | 1 | | | |
| SIG2 | MES1 | ECU1 | | | | | 7 | 12 | |
| SIG3 | MES2 | ECU1 | K4 | 1 | 15 | 1 | | | F |
| SIG4 | MES2 | ECU1 | | | | | 7 | 12 | |
| SIG5 | MES3 | ECU2 | K3 | 1 | 64 | 1 | | | |
| SIG6 | MES4 | ECU2 | ELSE | 2 | 64 | 2 | | | |

(52) U.S. Cl.
CPC ............... *H04L 12/40156* (2013.01); *H04L 2012/40215* (2013.01); *H04L 2012/40241* (2013.01)

(56) References Cited

U.S. PATENT DOCUMENTS

| | | | |
|---|---|---|---|
| 2008/0250236 A1* | 10/2008 | Bauereiss | G05B 19/0426 713/1 |
| 2010/0179669 A1* | 7/2010 | Wegener | G05B 19/0426 700/12 |
| 2011/0040390 A1 | 2/2011 | Blevins et al. | |
| 2013/0332030 A1 | 12/2013 | Koukes et al. | |

OTHER PUBLICATIONS

EP, Extended European Search Report for EP application No. 17169687.5, dated Oct. 17, 2017.

\* cited by examiner

| S | N | ECU | F | P1 | P2 | P3 | P4 | P5 |
|---|---|---|---|---|---|---|---|---|
| SIG1 | MES1 | ECU1 | F1 | 0 | 31 | 1 | | |
| SIG2 | MES1 | ECU1 | F2 | | | | 7 | 12 |
| SIG3 | MES2 | ECU1 | F1 | 0 | 15 | 1 | | |
| SIG4 | MES2 | ECU1 | F2 | | | | 7 | 12 |
| SIG5 | MES3 | ECU2 | F1 | 1 | 64 | 1 | | |
| SIG6 | MES4 | ECU2 | F1 | 2 | 64 | 2 | | |

Fig. 1

| F | K | V1 | V2 | V3 |
|---|---|---|---|---|
| F1 | K1 | 0 | 31 | 1 |
| F1 | K2 | 0 | 15 | |

Fig. 2

| S | N | ECU | F | K | P1 | P2 | P3 | P4 | P5 |
|---|---|---|---|---|---|---|---|---|---|
| SIG1 | MES1 | ECU1 | F1 | K1 | 0 | 31 | 1 | | |
| SIG2 | MES1 | ECU1 | F2 | | | | | 7 | 12 |
| SIG3 | MES2 | ECU1 | F1 | K2 | 0 | 15 | 1 | | |
| SIG4 | MES2 | ECU1 | F2 | | | | | 7 | 12 |
| SIG5 | MES3 | ECU2 | F1 | ELSE | 1 | 64 | 1 | | |
| SIG6 | MES4 | ECU2 | F1 | ELSE | 2 | 64 | 2 | | |

Fig. 3

| F | K | V1 | V2 | V3 | V6 |
|---|---|---|---|---|---|
| F1 | K1 | 0 | 31 | 1 | |
| F1 | K2 | 0 | 15 | | |
| F1 | K3 | 1 | 64 | 1 | |
| F1 | K4 | 1 | 15 | 1 | F |

Fig. 4

| S | N | ECU | K | P1 | P2 | P3 | P4 | P5 | P6 |
|---|---|---|---|---|---|---|---|---|---|
| SIG1 | MES1 | ECU1 | K3 | 1 | 64 | 1 | | | |
| SIG2 | MES1 | ECU1 | | | | | 7 | 12 | |
| SIG3 | MES2 | ECU1 | K4 | 1 | 15 | 1 | | | F |
| SIG4 | MES2 | ECU1 | | | | | 7 | 12 | |
| SIG5 | MES3 | ECU2 | K3 | 1 | 64 | 1 | | | |
| SIG6 | MES4 | ECU2 | ELSE | 2 | 64 | 2 | | | |

Fig. 5

METHOD FOR CONFIGURING CONTROL UNITS

CROSS REFERENCE TO RELATED APPLICATIONS

This application claims the benefit of European patent application no. EP17169687.5, filed on May 5, 2017. The entire contents of which are hereby incorporated by reference in its entirety.

FIELD OF THE INVENTION

The invention relates to a method for configuring control units.

BACKGROUND OF THE INVENTION

Control units are used for control or regulation in many different scenarios, for example in vehicles or in aircraft. Control units communicate with one another via buses or networks and communicate with their environment via sensors and actuators. The developer of the control unit stipulates during development when which information is processed by a control unit.

The "Bus Manager" program from dSPACE is known from the prior art for the purpose of configuring control units. In the program, a control unit may be assigned one or more messages which can be transmitted or received by the control unit. Each message in turn consists of one or more signals. In this case, a signal is understood as meaning a logical information unit and this is not necessarily a physical information unit. A plurality of signals can be combined to form larger units and these are referred to as Protocol Data Units, PDU for short. The bus manager makes it possible to individually adjust properties of signals, PDUs, messages and control units.

Different functionalities of a control unit, of a bus message, of a PDU or of a signal can be displayed in the bus manager. These functionalities can be selected and the associated parameters can be displayed. These parameters can then be individually adjusted.

If identical functionalities are intended to be newly parameterized at different locations, the respective functionalities are selected by the user for each element and the parameters of the individual functionalities are each newly set. This form of element-based parameterization is complicated and susceptible to errors.

BRIEF SUMMARY OF THE INVENTION

Against this background, the object of the present disclosure is to specify a method which develops the prior art.

The object is achieved by means of a method having the features of the present disclosure.

The present disclosure relates to a method for configuring at least one first functionality of real and/or simulated control units, in which: the first functionality belongs to a first functionality class; the first functionality comprises at least one function dependent on the first functionality class and at least one first parameter dependent on the first functionality class; and at least one control unit is assigned to the first functionality. The disclosed method further provides that: at least the first functionality class has, as categories, an else category and at least one first default category; the functionalities in the first functionality class each belong to a category; a first predetermined value is stored for the at least one first parameter for the first default category and, if the first functionality is assigned to the first default category, the first predetermined value is adopted for the at least one first parameter; if the first predetermined value of the parameter of the first default category changes, the change is adopted for all functionalities which have already been assigned to the first default category; and the control unit assigned to the first functionality is configured with the function and the values of the parameters of the first functionality.

In this case, a functionality class is understood as meaning the combination of a function and one or more parameters. The function describes an algorithm or an implementation rule which is intended to be carried out by the control unit, in particular an implementation rule for creating messages, wherein the messages are transmitted by the configured control unit via a bus or a network. One example of a functionality class is a so-called alive counter. If a signal is defined as an alive counter, its value is changed each time the associated message is transmitted according to the functionality. The function here may be, for example, that the value of the signal is set to a starting value during initialization, is increased by an increment value each time the associated message is transmitted and is set to the starting value again when a stop value is reached. In this case, the starting value, the increment value and the stop value are three parameters of the functionality.

In the case of functionalities having a multiplicity of parameters, if the functionality is assigned to a default category, the value predetermined for the respective parameter from the default category is adopted for each parameter.

In order to configure the control unit, a program code or at least one part of a program code is generated for the control unit from the created configuration and the program code is loaded onto the control unit. In the case of a simulated control unit, the program code is executed by a simulator. During operation, the control unit will carry out the configured functionalities. In one embodiment, parameters of a functionality may be changed during execution of the program code on the control unit or the simulator. The parameters may be changed from the program code or from another program executed on the simulator or control unit or parameters in the memory of the simulator or control unit may be overwritten from the outside.

A functionality is an entity of a functionality class. A functionality is assigned to a signal, a PDU, a message or a control unit. A signal is assigned to a PDU. A PDU is assigned to a message. A message is assigned to a control unit. A functionality is therefore directly or indirectly assigned to a control unit. The configured control unit carries out the corresponding function with the parameter values which have been set.

One advantage of the method according to the present disclosure is that the functionalities of the control units can be configured in a considerably more convenient manner and across the control units. Assigning a functionality to a default category results in the predetermined value(s) being adopted for the parameters of the functionality. In order to reconfigure a functionality, it is only necessary to assign it to another default category. The individual parameter values are automatically reconfigured by a data processing device which carries out the method according to the present disclosure. Changing the predetermined values of a default category changes the parameter values of all functionalities assigned to the default category. A group of functionalities can be reconfigured at the same time in this manner.

In one preferred embodiment, the first functionality class has a second default category, wherein a second predetermined value is stored for the at least one first parameter for the second default category and, if the functionality is assigned to the second default category, the second predetermined value is adopted for the at least one first parameter, wherein, if the second predetermined value of the first parameter of the second default category changes, the change is adopted for all functionalities which have already been assigned to the second default category.

One advantage of the embodiment is that a multiplicity of functionalities can be conveniently configured with different parameter sets. The second default category generally has the same properties as the first default category.

In one embodiment, the control units are connected to a common network.

Such a network may be a FlexRay or Ethernet network, for example. Alternatively, the control units may be connected to a bus, for example a CAN or LIN bus. The control units can interchange messages via the common network or the common bus.

In one embodiment, it is preferred for the functionality to be read from a network description file.

Such a network description file may be, for example, a file according to the AUTOSAR standard or a FIBEX file. A communication network is described in a network description file, the so-called bus communication matrix. Said file stores, inter alia, which control units calculate which functions and via which bus systems and using which packets and signals they communicate with one another. Functionalities can be introduced very easily into the configuration method by reading them from a network description file.

Alternatively, functionalities can also be predefined by a computer program which carries out the configuration method or can be newly created during the configuration method. This is advantageous for functionalities which are typically not included in network description files.

In one development, the predetermined values are read from a network description file.

The predefined values can be very easily introduced into the configuration method by reading them from a network description file. The values may already have been assigned to the functionality in the network description file. Alternatively, the predefined values may also be predefined by a computer program which carries out the configuration method.

In one preferred embodiment, the functionality is expanded by an additional function and/or an additional parameter by assigning it to a default category.

The practice of expanding functionalities is advantageous for functions which make it possible to simulate abnormal behavior and manipulation possibilities. A new functionality is therefore configured on the basis of an existing functionality. One example of such an expanded functionality is the temporary failure of an alive counter. For this purpose, the expanded functionality has a parameter for activating the failure. The activation parameter may be of the type of a Boolean variable, for example. The functionality may additionally comprise a parameter which can be used to set the value for the number of failures. The interaction of a real control unit with a stationary alive counter can be tested using a functionality expanded in this manner.

In another embodiment, a third functionality assigned to the first functionality class is automatically assigned to the first default category if, after an individual change in a value of a parameter of the third functionality, the values of all parameters of the third functionality correspond to the respective predetermined values of the first default category.

The assignment to the first default category is therefore carried out on the basis of a comparison of the values of the parameters with the predetermined values and the functionality is assigned to the default category. The values of the parameters can therefore be stipulated by assigning the functionality to the default category and the assignment of the functionality to the default category can be stipulated by inputting the same values.

According to another development, a fourth functionality is automatically assigned to the else category if a value of a parameter of the fourth functionality is individually changed and there is no default category whose predetermined values correspond to the parameter values of the fourth functionality.

The else category is a reservoir for those functionalities which are not assigned to a default category. The else category does not contain any predetermined values for parameters. As a result, each functionality is assigned to a category, either a default category or the else category. This improves the structuring of the functionalities.

In one development, a third default category is generated from a second functionality in the first functionality class by selecting the second functionality and storing the value of the at least one parameter of the second functionality as a predetermined value for the third default category.

A second functionality becomes the basis for a third default category. In this case, the second functionality is preferably assigned to the else category and is assigned to the third default category after the third default category has been created. The values of the parameters of the second functionality become the predetermined values of the third default category in this case. The predetermined values may be changed or removed. For functionalities in the first function class which are assigned to the third default category, the predetermined values for the parameters are adopted upon assignment.

The advantage of the embodiment is that further functionalities can be easily configured for the parameter values of the second functionality, from which the third default category was generated.

In one embodiment, the functionality is assigned to a message to be transmitted by the associated control unit.

Assigning the functionality to a message is particularly advantageous if the functionality describes a property of the message. The configured message is transmitted by the control unit via a bus or a network connected to the control unit. Such a property of the message may be end-to-end protection, for example. End-to-end protection means here that the message is protected during transmission on the bus using a calculated CRC value while taking into account an alive counter and a data ID, with the result that transmission errors can be detected at the receiver end.

In another embodiment, the functionality is assigned to a signal to be transmitted by the associated control unit.

Assigning the functionality to a signal is particularly advantageous if the functionality describes a property of the signal, for example a default value. A signal is typically part of a message, that is to say a message is composed of one or more signals. In addition to the signals, a message typically contains management information, for example an ID, a recipient and/or a sender.

In one advantageous embodiment, the first functionality comprises a second parameter, wherein a predetermined value is not stored for the second parameter in the first default category, wherein the value of the second parameter remains unchanged upon assigning the functionality to the first default category.

The practice of storing predetermined values only for some of the parameters of the functionality in the default category is advantageous if some of the parameters are intended to be individually set, but other parameters are intended to be identical for a multiplicity of functionalities. According to the present disclosure, the parameters can then be set with identical values by assigning the functionalities to the same default category. The parameters without predetermined values can be individually set without canceling the assignment to the default category. If a predetermined value is set in the default category for a parameter for which a predetermined value was not yet included, the newly set predetermined value is adopted for the corresponding parameters of all functionalities assigned to the default category.

The present disclosure also comprises a data processing device having a processor unit, wherein the data processing device is designed to carry out the method according to the present disclosure.

The present disclosure also includes a computer program product having computer-implemented instructions, which carries out the steps of the method according to the present disclosure after being loaded and executed in a suitable data processing device.

The present disclosure also comprises a digital storage medium having electronically readable control signals which can interact with a programmable data processing device such that the method according to the present disclosure is carried out on the data processing device.

DESCRIPTION OF THE DRAWINGS

The present disclosure is explained in more detail below with reference to the drawings. In this case, identical parts are labeled with identical designations. In this example, signals are directly assigned to messages. It goes without saying that signals can also be assigned to PDUs, as described above, and the PDUs can then be assigned to messages. In the drawings:

FIG. 1 shows a schematic view of an assignment of functionalities to signals,

FIG. 2 shows a schematic view of default categories of a functionality class,

FIG. 3 shows a schematic view of an assignment of functionalities to signals by means of categories, FIG. 4 shows a further schematic view of default categories of a functionality class, FIG. 5 shows a further schematic view of an assignment of functionalities to signals by means of categories

DETAILED DESCRIPTION

Figure 6:
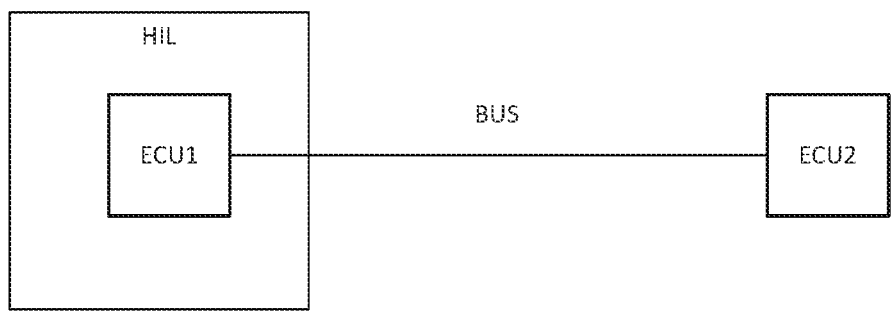
FIG. 6 shows a schematic view of two configured control units.

The illustration in FIG. 1 shows a schematic view of an assignment of functionalities to signals. In the example in FIG. 1, six signals SIG1, SIG2, SIG3, SIG4, SIG5, SIG6 are each assigned a functionality. In this case, each row, apart from the first row, shows the properties of a functionality. A functionality in a first function class F1 is respectively assigned to the first signal SIG1, the third signal SIG3, the fifth signal SIG5 and the sixth signal SIG6. A functionality in the second function class F2 is respectively assigned to the second signal SIG2 and the fourth signal SIG4.

The first function class F1 comprises three parameters P1, P2, P3. The second function class comprises a fourth parameter P4 and a fifth parameter P5. The values of the parameters are individually set for each functionality. In this example, the values of the parameters are integers. Parameters of function classes may also be designed for other types of values. Examples of types of values are floating-point numbers, Boolean variables and character strings.

In this example, the first function class F1 is the class of the alive counter. The first parameter P1 is a starting value, the second parameter P2 is a stop value and the third parameter P3 is an increment value.

The first signal SIG1 and the second signal SIG2 are assigned to a first message MES1. The third signal SIG3 and the fourth signal SIG4 are assigned to a second message MES2. The fifth signal SIG5 and the sixth signal SIG6 are assigned to a third message MES3. The first message MES1 and the second message MES2 are assigned to a first control unit ECU1. The third message MES3 is assigned to a second control unit ECU2.

The illustration in FIG. 2 illustrates a schematic view of default categories of a functionality class. The function class F1 has two default categories K1, K2. Each default category has three predetermined values V1, V2, V3 for the three parameters P1, P2, P3 of the functionalities in the first function class F1. If a functionality is assigned to the first default category K1, the first predetermined value V1 is adopted for the first parameter P1, the second predetermined value V2 is adopted for the second parameter P2 and the third predetermined value V3 is adopted for the value of the third parameter P3. The third predetermined value V3 is not allocated for the second default category K2. If a functionality is assigned to the second default category K2, the first predetermined value V1 is adopted for the first parameter P1, the second predetermined value V2 is adopted for the second parameter P2 and the value of the third parameter P3 remains unchanged. The value of the third parameter P3 can be individually changed without breaking the assignment of the functionality to the second default category. In addition to the default categories, there is also an ELSE category. The ELSE category does not have any predetermined values. Functionalities in a function class which are not assigned to a default category are automatically assigned to the ELSE category.

FIG. 3 shows a schematic view of an assignment of functionalities to signals by means of categories. Only the differences with respect to the illustration in FIG. 1 are explained below. The functionalities in the first function class are each assigned to a category. The functionality assigned to the first signal SIG1 is assigned to the first default category K1. The functionality assigned to the third signal SIG3 is assigned to the second default category K2. The functionality assigned to the fifth signal SIG5 and the functionalities assigned to the sixth signal SIG6 are assigned to the ELSE category ELSE. The second signal SIG2 and the fourth signal SIG4 are assigned to the second function class F2 and therefore cannot be assigned to a category of the first function class F1.

FIG. 4 shows a further schematic view of default categories of a functionality class. Only the differences with respect to the illustration in FIG. 2 are explained below. A third default category K3 is created from the parameter values of the function assigned to the fifth signal SIG5 from FIG. 3. The values of the three parameters P1, P2, P3 become the three predetermined values V1, V2, V3 of the third default category K3. A fourth default category K4 is created. The functionality of the fourth default category K4 has been expanded in comparison with the three other default categories K1, K2, K3. The functionality of the fourth default category K4 belongs to the first function class F1 and, in addition to the three predetermined values V1, V2, V3 already described, comprises a fourth predetermined value V6. The fourth predetermined value V6 is of the type of a Boolean variable and is assigned the value false in this example. The new functionality of the fourth default category makes it possible to switch off the alive counter at the runtime for the purpose of error simulation. In this case, the fourth predetermined value V6 determines whether the alive counter is switched on or switched off at the outset.

FIG. 5 shows a schematic view of an assignment of functionalities to signals by means of categories. Only the differences with respect to the illustration in FIG. 3 are explained below. The functionality assigned to the first signal SIG1 is assigned to the third default category K3. As a result of the assignment, the value of the first parameter P1 is set to the value of the first predetermined value V1 of the third default category K3. As a result of the assignment, the value of the second parameter P2 is likewise set to the value of the second predetermined value V2 of the third default category K3 and the value of the third parameter P3 is set to the value of the third predetermined value V3 of the third default category K3. The three parameter values P1, P2, P3 of the functionality assigned to the fifth signal SIG5 correspond to the three predetermined values V1, V2, V3 of the third default category K3, as a result of which the functionality is automatically assigned to the third default category. The functionality assigned to the third signal SIG3 is assigned to the fourth default category K4, as a result of which the functionality is expanded with the possibility of activating the failure and is provided with a sixth parameter P6. As a result of the functionality being assigned to the fourth default category, the value of the sixth parameter P6 is set to the fourth predetermined value V6 of the fourth default category K4. If the value of the sixth parameter P6 is set to the value "true" at the runtime, the failure of the alive counter is activated and the alive counter is not updated during subsequent transmissions by the control unit.

FIG. 6 shows a schematic view of two configured control units. The program code or at least one part of the program code is then created for the control units ECU1, ECU2 from the configured functionalities. The program code is then transmitted to the respective control unit. The first control unit ECU1 is a simulated control unit in this example. A simulator HIL executes the program code created for the first control unit ECU1. The first control unit ECU1 is connected to the second control unit ECU2 via a signal line BUS. The second control unit ECU2 executes the program code created for the second control unit ECU2. The first control unit ECU1 generates the first message MES1 having the first signal SIG1 and the second signal SIG2. In this case, the first signal SIG1 is generated on the basis of the functionality assigned to the first signal and the values of the parameters P1, P2, P3 of the functionality. The second signal SIG2 is generated on the basis of the functionality assigned to the second signal and the values of the parameters P4, P5 of the functionality. The first message MES1 is then transmitted via the signal line BUS. The first control unit ECU1 likewise generates the second message MES2 having the third signal SIG3 and the fourth signal SIG4 on the basis of the functionality assigned to the third signal SIG3 and the functionality assigned to the fourth signal SIG4 and transmits the second message MES2 via the signal line BUS. The second control unit generates the third message MES3 having the fifth signal SIG5 on the basis of the functionality assigned to the fifth signal SIG5 and generates the fourth message MES4 having the sixth signal SIG6 on the basis of the functionality assigned to the sixth signal SIG6. The second control unit transmits the third message MES3 and the fourth message MES4 to the first control unit via the signal line BUS.

It goes without saying that the method can be extended to any number of control units, messages, signals, functionality classes, parameters and categories.

What is claimed is:

1. A method for configuring at least one first functionality of real and/or simulated control units, the method comprising:
assigning at least one control unit to the first functionality, wherein the first functionality belongs to a first functionality class having an else category and at least one default category, wherein the first functionality comprises at least one function dependent on the first functionality class and at least one first parameter dependent on the first functionality class, wherein the functionalities in the first functionality class each belong to at least one category;
storing a first predetermined value for the at least one first parameter for the first default category;
adopting the first predetermined value for the at least one first parameter, if the first functionality is assigned to the first default category;
adopting the change for all functionalities which have already been assigned to the first default category, if the first predetermined value of the parameter of the first default category changes;
configuring the control unit assigned to the first functionality with the function and the values of the parameters of the first functionality; and
expanding the first functionality by an additional function and/or an additional parameter by assigning the first functionality to a default category.

2. The method of 1, wherein the first functionality class has a second default category, wherein a second predetermined value is stored for the at least one first parameter for the second default category and, if the functionality is assigned to the second default category, adopting the second predetermined value for the at least one first parameter, wherein, if the second predetermined value of the first parameter of the second default category changes, adopting the change for all functionalities which have already been assigned to the second default category.

3. The method of claim 1, wherein the control units are connected to a common network.

4. The method of claim 1, comprising reading the functionality from a network description file.

5. The method of claim 1, comprising reading the predetermined values from a network description file.

6. The method of claim 1, comprising automatically assigning a third functionality assigned to the first functionality class to the first default category if, after an individual change in a value of a parameter of the third functionality, the values of all parameters of the third functionality correspond to the respective predetermined values of the first default category.

7. The method of claim 1, comprising automatically assigning a fourth functionality to the else category if a value of a parameter of the fourth functionality is individually changed and there is no default category whose predetermined values correspond to the parameter values of the fourth functionality.

8. The method of claim 1, comprising generating a third default category from a second functionality in the first functionality class by selecting the second functionality and storing the value of the at least one parameter of the second functionality as a predetermined value for the third default category.

9. The method of claim 1, comprising assigning the functionality to a message or PDU to be transmitted or received by the associated control unit.

10. The method of claim 1, comprising assigning the functionality to a signal to be transmitted or received by the associated control unit.

11. The method of claim 1, wherein the first functionality comprises a second parameter, wherein a predetermined value is not stored for the second parameter in the first default category, keeping the value of the second parameter unchanged upon assigning the functionality to the first default category.

12. A data processing device having a processor unit, wherein the data processing device is designed to carry out the method of claim 1.

13. A computer program product stored on a non-transitory computer-readable storage medium having computer-implemented instructions which carry out the steps of the method of claim 1 after being loaded and executed in a data processing device.

14. A non-transitory computer-readable digital storage medium having electronically readable control signals which can interact with a programmable data processing device such that the method of claim 1 is carried out on the data processing device.

* * * * *